United States Patent
Hirasawa

(10) Patent No.: US 9,161,474 B2
(45) Date of Patent: Oct. 13, 2015

(54) DISPLAY DEVICE

(71) Applicant: Sony Corporation, Tokyo (JP)

(72) Inventor: Takeaki Hirasawa, Tokyo (JP)

(73) Assignee: Sony Corporation (JP)

( * ) Notice: Subject to any disclaimer, the term of this patent is extended or adjusted under 35 U.S.C. 154(b) by 134 days.

(21) Appl. No.: 13/947,425

(22) Filed: Jul. 22, 2013

(65) Prior Publication Data

US 2014/0043738 A1 Feb. 13, 2014

(30) Foreign Application Priority Data

Aug. 10, 2012 (JP) ................. 2012-177824

(51) Int. Cl.
G06F 1/16 (2006.01)
H05K 7/14 (2006.01)
F16M 11/04 (2006.01)
F16M 11/08 (2006.01)
F16M 11/20 (2006.01)
F16M 13/02 (2006.01)

(52) U.S. Cl.
CPC .............. *H05K 7/14* (2013.01); *F16M 11/046* (2013.01); *F16M 11/08* (2013.01); *F16M 11/2021* (2013.01); *F16M 13/02* (2013.01); *F16M 2200/022* (2013.01); *F16M 2200/024* (2013.01); *F16M 2200/044* (2013.01)

(58) Field of Classification Search
CPC .................................... G06F 1/616; G06F 1/16
USPC ................................................. 361/679.55
See application file for complete search history.

(56) References Cited

U.S. PATENT DOCUMENTS

| | | | | |
|---|---|---|---|---|
| 6,905,101 B1 * | 6/2005 | Dittmer | ...................... | 248/274.1 |
| 7,152,836 B2 * | 12/2006 | Pfister et al. | ............. | 248/292.14 |
| 7,298,610 B2 * | 11/2007 | Kim et al. | ................ | 361/679.55 |
| 7,430,113 B2 * | 9/2008 | McRight et al. | ......... | 361/679.55 |
| 7,513,468 B2 | 4/2009 | Jung et al. | | |
| 7,604,206 B2 | 10/2009 | Jung et al. | | |
| 7,819,368 B2 | 10/2010 | Jung et al. | | |
| 8,259,437 B2 * | 9/2012 | Vesely | ...................... | 361/679.01 |
| 8,333,355 B2 * | 12/2012 | Stifal et al. | ................. | 248/279.1 |
| 8,605,430 B2 * | 12/2013 | Chen et al. | ................ | 361/679.55 |
| 8,665,585 B2 * | 3/2014 | Ko | ........................... | 361/679.02 |
| 8,767,383 B2 * | 7/2014 | Ahn et al. | ................ | 361/679.27 |
| 2009/0256040 A1 * | 10/2009 | Lee et al. | ................. | 248/224.61 |
| 2011/0283632 A1 * | 11/2011 | Sutton et al. | ................... | 52/36.1 |

FOREIGN PATENT DOCUMENTS

JP 2006-154842 A 6/2006

* cited by examiner

*Primary Examiner* — Forrest M Phillips
(74) *Attorney, Agent, or Firm* — Lerner, David, Littenberg, Krumholz & Mentlik, LLP

(57) ABSTRACT

Provided is a display device, including: a device main body including a display, the display including a display surface, the display surface being configured to display an image; and a stand configured to support the device main body. The stand includes a supported portion, the supported portion being slidably supported on a surface opposite to the display surface of the device main body, and a connection portion, the connection portion being rotatable with respect to the supported portion around a hinge shaft.

9 Claims, 18 Drawing Sheets

DISPLAY DEVICE

CROSS-REFERENCE TO RELATED APPLICATIONS

The present application claims the benefit of Japanese Patent Application No. 2012-177824, filed on Aug. 10, 2012, the disclosure of which is incorporated herein by reference.

BACKGROUND

The present disclosure relates to a technical field of a display device. Specifically, the present disclosure relates to a technical field of providing a supported portion and a connection portion on a stand, and simplifying and downsizing the structure. The supported portion is slidably supported on a device main body. The connection portion is rotatable with respect to the supported portion around a hinge shaft.

There are various display devices. Examples of display devices include display devices of a television receiver and the like, monitors for a personal computer, a display system, and the like, and mobile terminal devices such as a tablet terminal, a mobile phone, and an electronic book.

Some display devices include stands. A stand is used when a device main body including a display is mounted on a mount surface of a desk or the like.

Stands of some display devices are folded in the wall-hanged status. Some stands rotate around a hinge shaft or a plurality of hinge shafts, and are folded.

The structure including the hinge shaft(s) includes the following two main structures.

First, according to a single hinge structure, a stand folding structure includes one hinge shaft. According to the single hinge structure, one hinge structure supports the weight of a device main body. For example, as shown in FIG. 17 and FIG. 18, according to the single hinge structure, a stand b of a display device a includes a support portion d and a support board portion f. The support portion d is fixed on a device main body c. The support board portion f is supported such that the support board portion f is rotatable with respect to the support portion d around a hinge shaft e. In the standing status, the support board portion f of the display device a is mounted on a mount surface x. The stand b supports the device main body c (see FIG. 17). Meanwhile, in the wall-hanged status, the support board portion f of the display device a rotates around the hinge shaft e, and is behind the back surface side of the device main body c. The display 5 is thus mounted on a wall surface y (see FIG. 18).

Second, according to a double hinge structure, a stand folding structure includes two hinge shafts (for example, see Japanese Patent Application Laid-open No. 2006-154842). According to the double hinge structure, two hinge structures support the weight of a device main body. For example, as shown in FIG. 19 and FIG. 20, according to the double hinge structure, a stand b of a display device g includes a support portion d and a support board portion f. The support portion d is supported such that the support portion d is rotatable with respect to a device main body c around a first hinge shaft e. The support board portion f is supported such that the support board portion f is rotatable with respect to the support portion d around a second hinge shaft e. In the standing status, the support board portion f of the display device g is mounted on a mount surface x. The stand b supports the device main body c (see FIG. 19). Meanwhile, in the wall-hanged status, the support portion d of the display device g rotates around the first hinge shaft e. In addition, the support board portion f rotates around the second hinge shaft e, and is behind the back surface side of the device main body c. The support board portion f is mounted on a wall surface y (see FIG. 20).

SUMMARY

However, in the single hinge structure, the support portion d is fixed on the device main body c. The support board portion f is supported such that the support board portion f is rotatable with respect to the support portion d around the hinge shaft e. Because of this, in the state where the display device a is hanged in the wall-hanged status and where the support board portion f rotates behind the back surface side of the device main body c, a part of the support board portion f protrudes downward from the device main body c (FIG. 19 see). The size of the entire display device a including the stand b is large, which is problematic.

Meanwhile, according to the double hinge structure, in the wall-hanged status, both the support portion d and the support board portion f rotate. The entire stand b is at the back surface side of the device main body c. Because of this, the display device g may be downsized. However, the number of hinge shafts is larger. Because of this, the structure of the display device g is complicated, which is problematic.

In view of the above-mentioned circumstances, it is desirable to provide a display device, which has a simple structure and is downsized.

First, there is provided a display device, including: a device main body including a display, the display including a display surface, the display surface being configured to display an image; and a stand configured to support the device main body. The stand includes a supported portion, the supported portion being slidably supported on a surface opposite to the display surface of the device main body, and a connection portion, the connection portion being rotatable with respect to the supported portion around a hinge shaft.

Because of this, the connection portion of the display device is rotatable with respect to the supported portion. In addition, the supported portion is slidable with respect to the device main body.

Second, the display device may further include a lock unit configured to lock one of the supported portion and the connection portion with respect to the other of the connection portion and the supported portion within a rotation range.

The lock unit locks the supported portion or the connection portion with respect to the connection portion or the supported portion within a rotation range. Because of this, the device main body is prevented from falling down because of its weight or when an external force is applied.

Third, in the display device, a plurality of concave portions may be formed on one of the supported portion and the connection portion, the plurality of concave portions being distant from each other, and the lock unit may be mounted on the other of the connection portion and the supported portion, the lock unit may engage with one of the concave portions, and the lock unit may be locked.

The plurality of concave portions are formed on the supported portion or the connection portion. The plurality of concave portions are distant from each other. The lock unit is mounted on the connection portion or the supported portion. The lock unit engages with the concave portion, and is locked. As a result, rotation of the supported portion with respect to the connection portion is restricted, and the lock unit is locked.

Fourth, the display device may further include a lock pin as the lock unit, the lock pin being inserted in the other of the connection portion and the supported portion.

The lock pin is provided as the lock unit. The lock pin is inserted in the connection portion or the supported portion. Because of this, the lock pin restricts rotation of the supported portion with respect to the connection portion. The lock unit is thus locked.

Fifth, the display device may further include a friction mechanism configured to generate friction between the connection portion and the supported portion.

The friction mechanism is provided between the connection portion and the supported portion. The friction mechanism generates friction. Because of this, the connection portion rotates with respect to the supported portion in the state where friction is generated.

Sixth, in the display device, a mounted hole for wall-hanging may be formed on the connection portion of the stand.

The mounted hole for wall-hanging is formed on the connection portion of the stand. Because of this, the display device may be hanged in the wall-hanged status by using the mounted hole.

Seventh, the display device may further include a rail member provided on the opposite surface of the device main body, the rail member being configured to slidably support the supported portion. The rail member may be provided on the device main body, the rail member extending from one end portion to the other end portion in a direction orthogonal to the thickness direction of the display.

The rail member extends from one end portion to the other end portion of the device main body. Because of this, the position of the device main body may be adjusted within a larger range.

Eighth, in the display device, the rail member may be bent.

Because the rail member is bent, the stand is slidable along the rail member having such a shape.

Ninth, in the display device, the rail member may be provided such that a direction in which one end in the longitudinal direction extends is orthogonal to a direction in which the other end extends.

The rail member is provided such that a direction in which one end in the longitudinal direction extends is orthogonal to a direction in which the other end extends. Because of this, the display may be turned around by 90°.

According to the present technology, there is provided a display device, including: a device main body including a display, the display including a display surface, the display surface being configured to display an image; and a stand configured to support the device main body. The stand includes a supported portion, the supported portion being slidably supported on a surface opposite to the display surface of the device main body, and a connection portion, the connection portion being rotatable with respect to the supported portion around a hinge shaft.

Because of this, a single hinge structure may simplify the structure. The single hinge structure includes one hinge shaft. In addition, the entire stand may be at the back surface side of the device main body. The structure may be simplified and downsized.

Second, the display device further includes a lock unit configured to lock one of the supported portion and the connection portion with respect to the other of the connection portion and the supported portion within a rotation range.

Because of this, it is possible to prevent the device main body from being broken or damaged. In addition, the device main body is locked at a predetermined angle of inclination. User-friendliness may thus be improved.

Third, a plurality of concave portions are formed on one of the supported portion and the connection portion, the plurality of concave portions being distant from each other, and the lock unit is mounted on the other of the connection portion and the supported portion, the lock unit engages with one of the concave portions, and the lock unit is locked.

Because of this, it is possible to lock the device main body at a plurality of positions. User-friendliness may thus be improved more.

Fourth, the display device further includes a lock pin as the lock unit, the lock pin being inserted in the other of the connection portion and the supported portion.

Because of this, the structure of the lock unit is simple. User-friendliness may thus be improved while the mechanism is simple.

Fifth, the display device further includes a friction mechanism configured to generate friction between the connection portion and the supported portion.

Because of this, the device main body is held at an arbitrary angle of inclination because of a frictional force. User-friendliness may thus be improved.

Sixth, a mounted hole for wall-hanging is formed on the connection portion of the stand.

Because of this, it is not necessary to additionally provide a single-purpose wall-hanging unit. It is possible to easily mount the display device on a wall surface with the simple structure.

Seventh, the display device further includes a rail member provided on the opposite surface of the device main body, the rail member being configured to slidably support the supported portion. The rail member is provided on the device main body, the rail member extending from one end portion to the other end portion in a direction orthogonal to the thickness direction of the display.

Because of this, the position of the device main body may be adjusted within a larger range. Visibility of images displayed on the display surface may be improved. User-friendliness may thus be improved.

Eighth, the rail member is bent.

Because of this, it is possible to arbitrarily set the relative posture of the device main body with respect to the stand depending on the shapes of the rail member.

Ninth, the rail member is provided such that a direction in which one end in the longitudinal direction extends is orthogonal to a direction in which the other end extends.

Because of this, user-friendliness to visibility of images may thus be improved.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 1 is a perspective view showing the display device;

FIG. 2 is a perspective view showing the display device seen from a direction different from the direction of FIG. 1;

FIG. 3 is an enlarged perspective view showing a state where a rail member supports a stand;

FIG. 4 is an enlarged perspective view showing a supported portion and a connection portion;

FIG. 5 is an exploded perspective view showing the stand;

FIG. 6 is a perspective view showing mounted holes of the stand and mount pins;

FIG. 7 is a side view schematically showing a state where a device main body is upright in a standing status;

FIG. 8 is a side view schematically showing a state where the device main body is inclined in the standing status;

FIG. 9 is an enlarged perspective view showing a state where a lock pin locks the supported portion;

FIG. 10 is an enlarged perspective view showing a state where a hinge shaft supports a spring member;

FIG. 11 is a side view schematically showing a state where the device main body is slid in the standing status;

FIG. 12 is a side view schematically showing a state where the stand is yet to be placed at the back surface side of the device main body in a wall-hanged status;

FIG. 13 is an enlarged perspective view showing a state where the connection portion rotates at a maximum within a rotation range;

FIG. 14 is a side view schematically showing a state where the stand is placed at the back surface side of the device main body in the wall-hanged status;

FIG. 15 is a perspective view showing an example of rail members provided from one end portion to the other end portion of the device main body;

FIG. 16 is a perspective view showing an example of bent rail members;

FIG. 17 is a side view schematically showing a state where a display device having a single hinge structure is in a standing status;

FIG. 18 is a side view schematically showing a state where the display device having the single hinge structure is in a wall-hanged status;

FIG. 19 is a side view schematically showing a state where a display device having a double hinge structure is in a standing status; and FIG. 20 is a side view schematically showing a state where the display device having the double hinge structure is in a wall-hanged status.

DETAILED DESCRIPTION OF EMBODIMENTS

Figure 1:
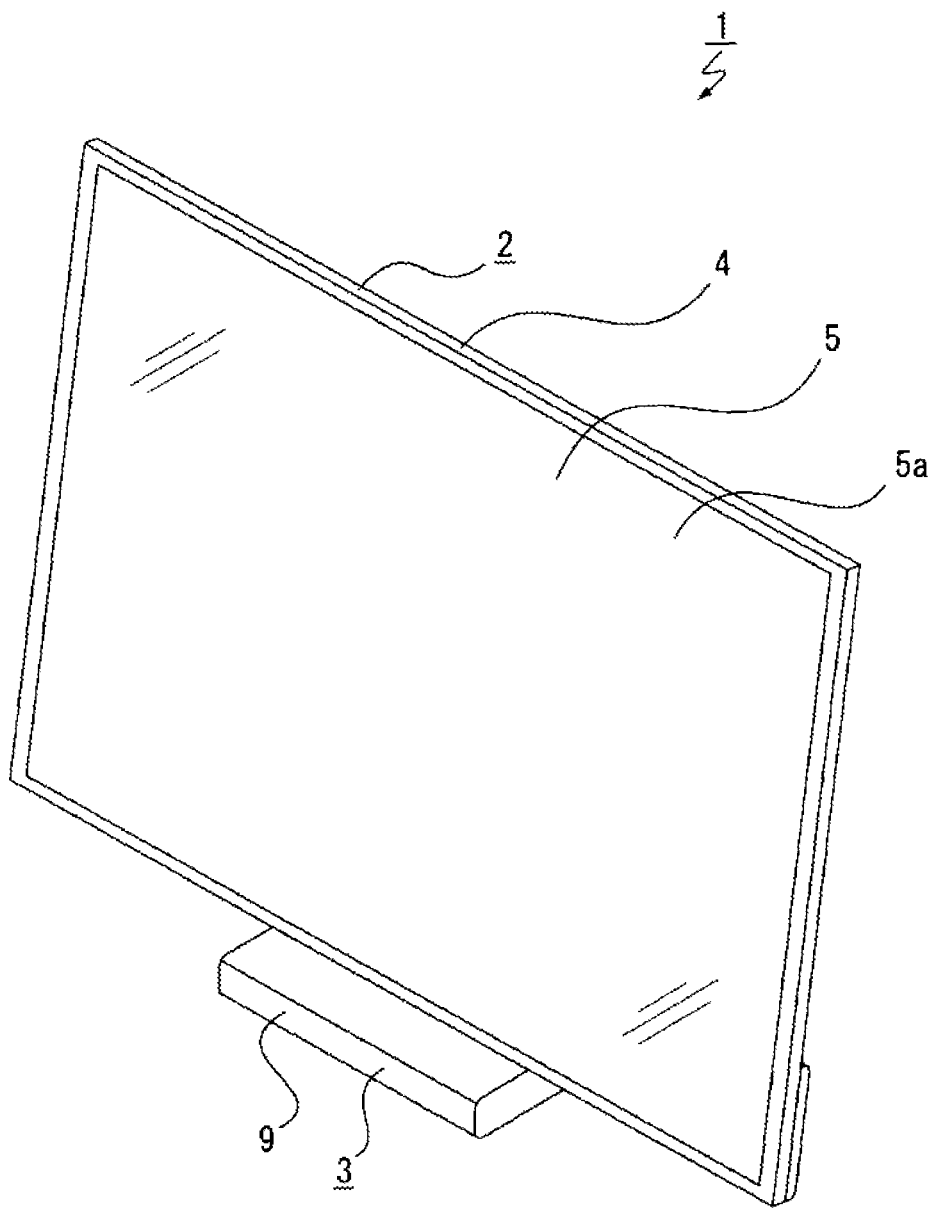
FIG. 1 to FIG. 16 are diagrams each showing a display device of the present technology.
Figure 2:
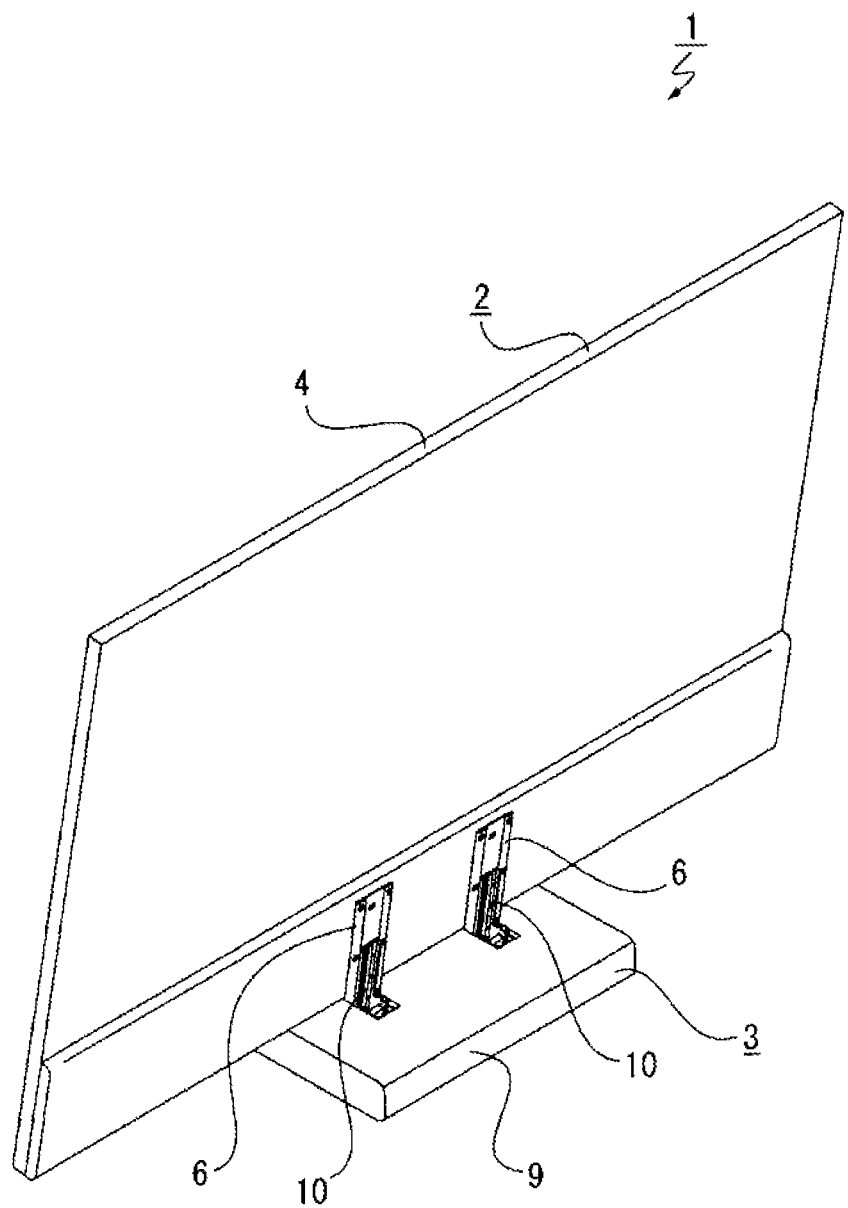
Figure 3:
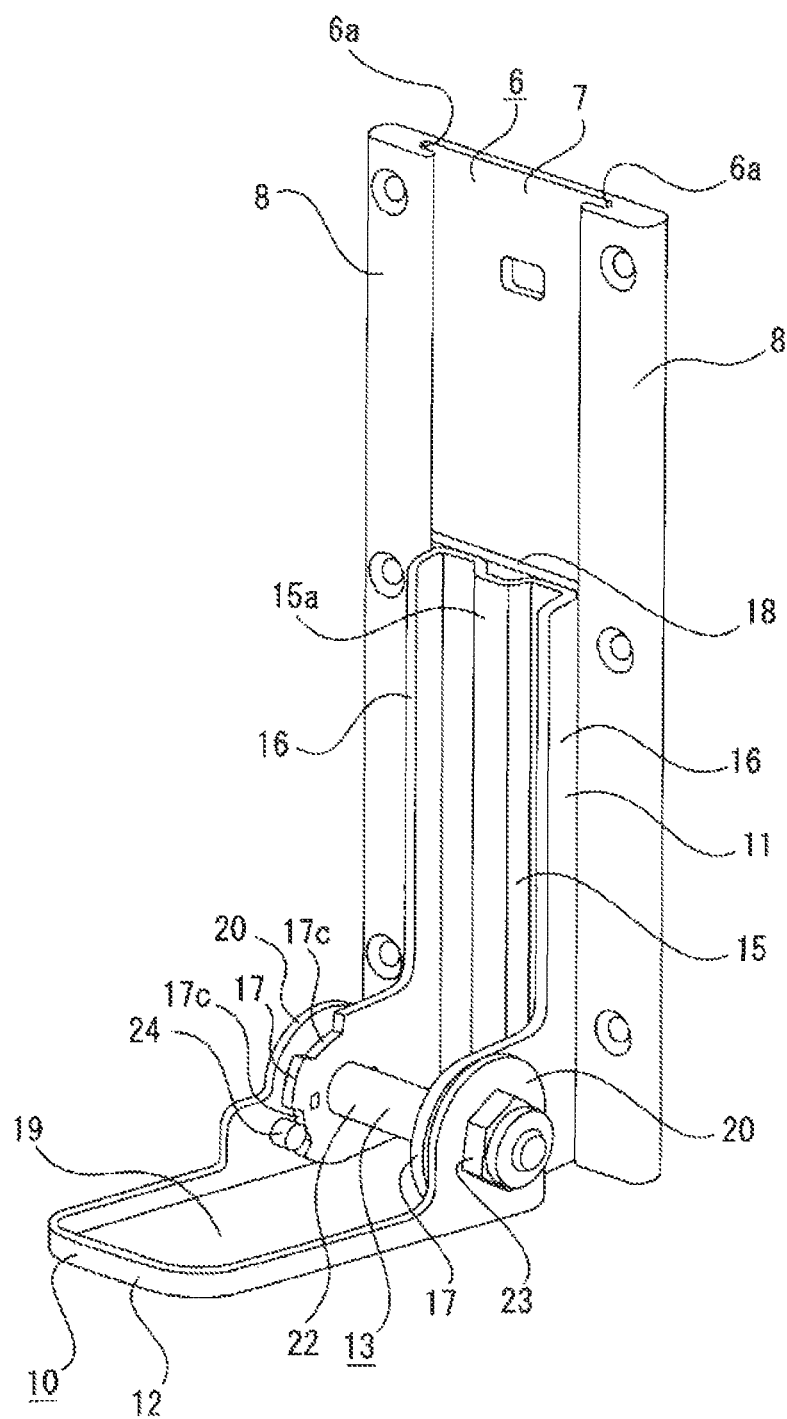
Figure 4:
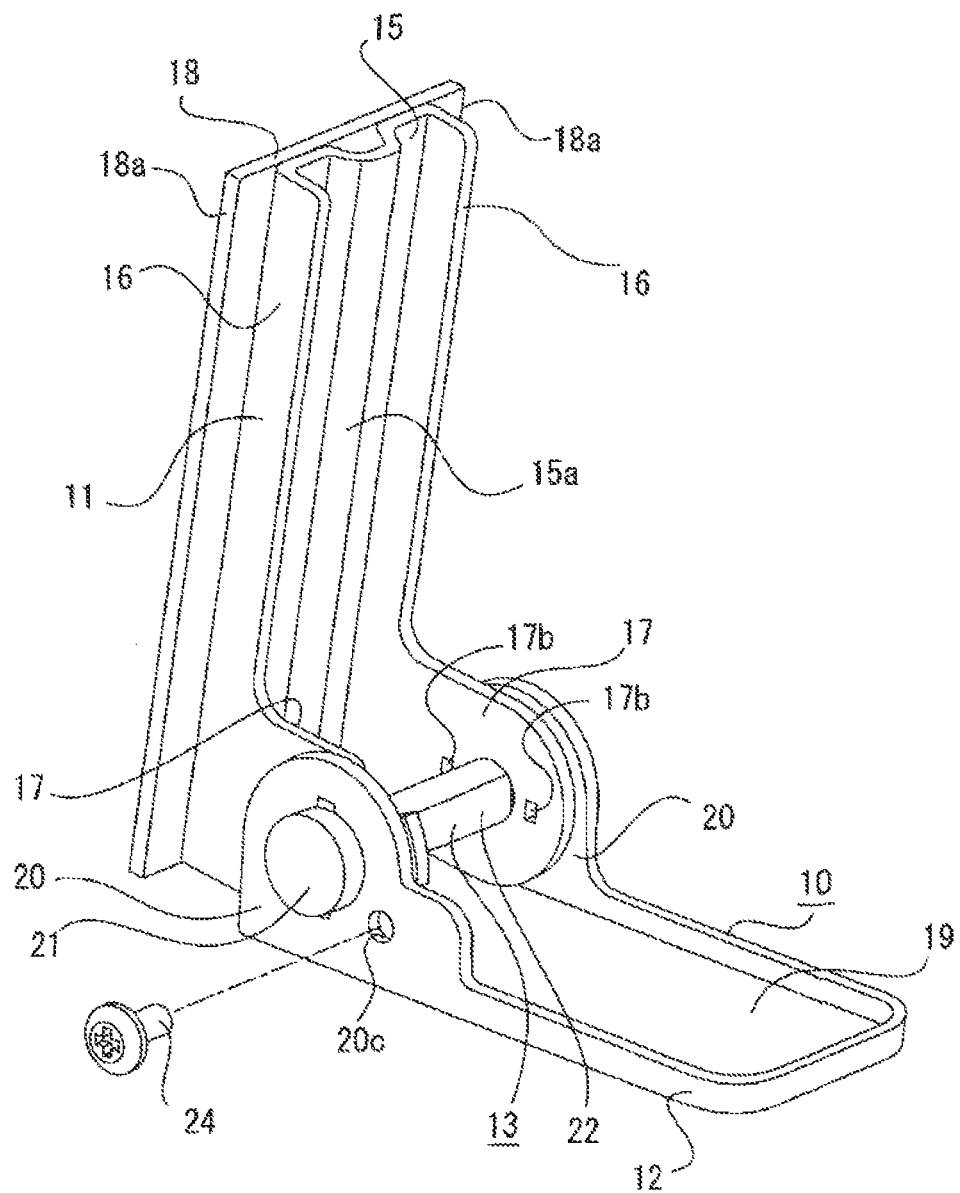
Figure 5:
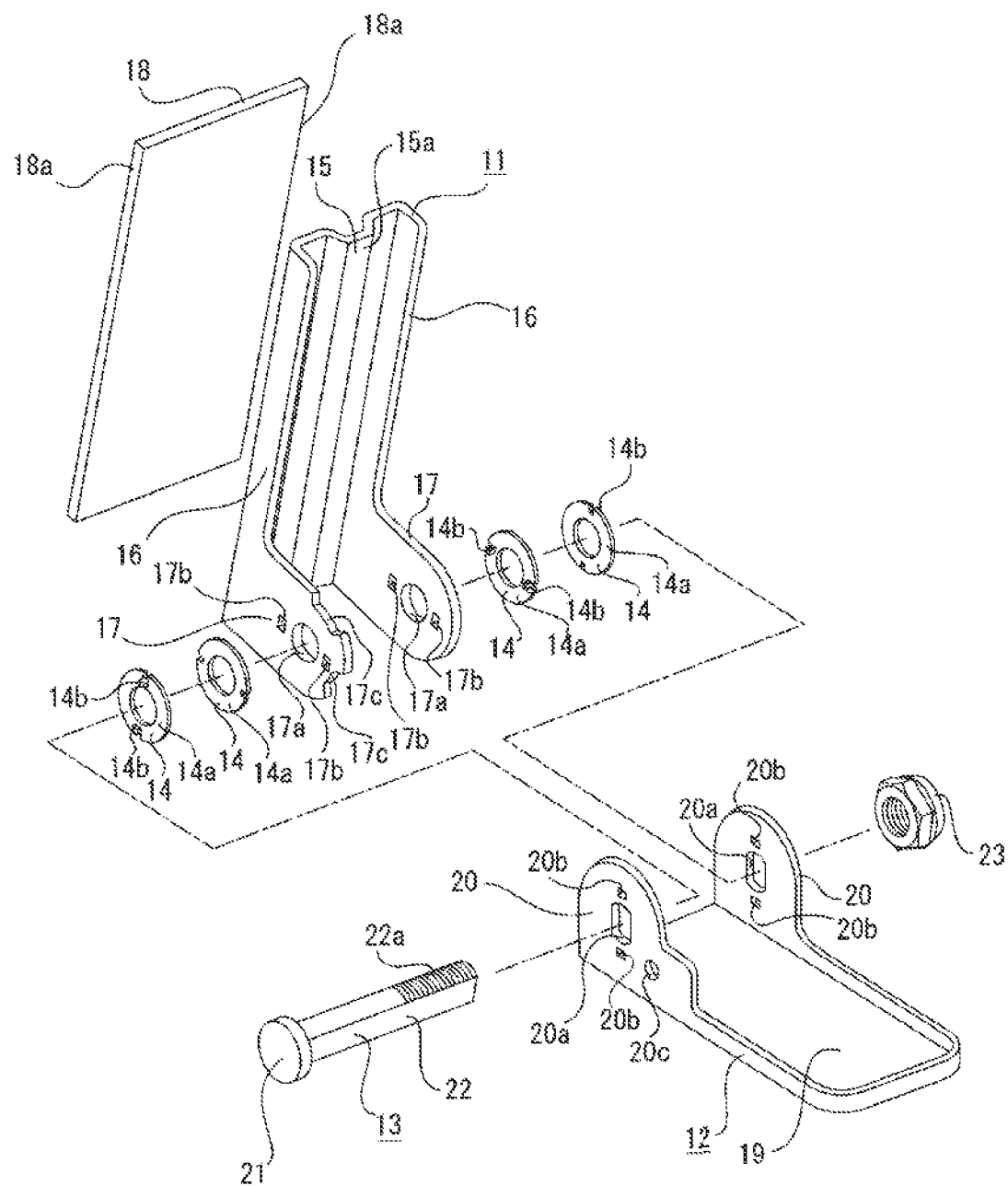
Figure 6:
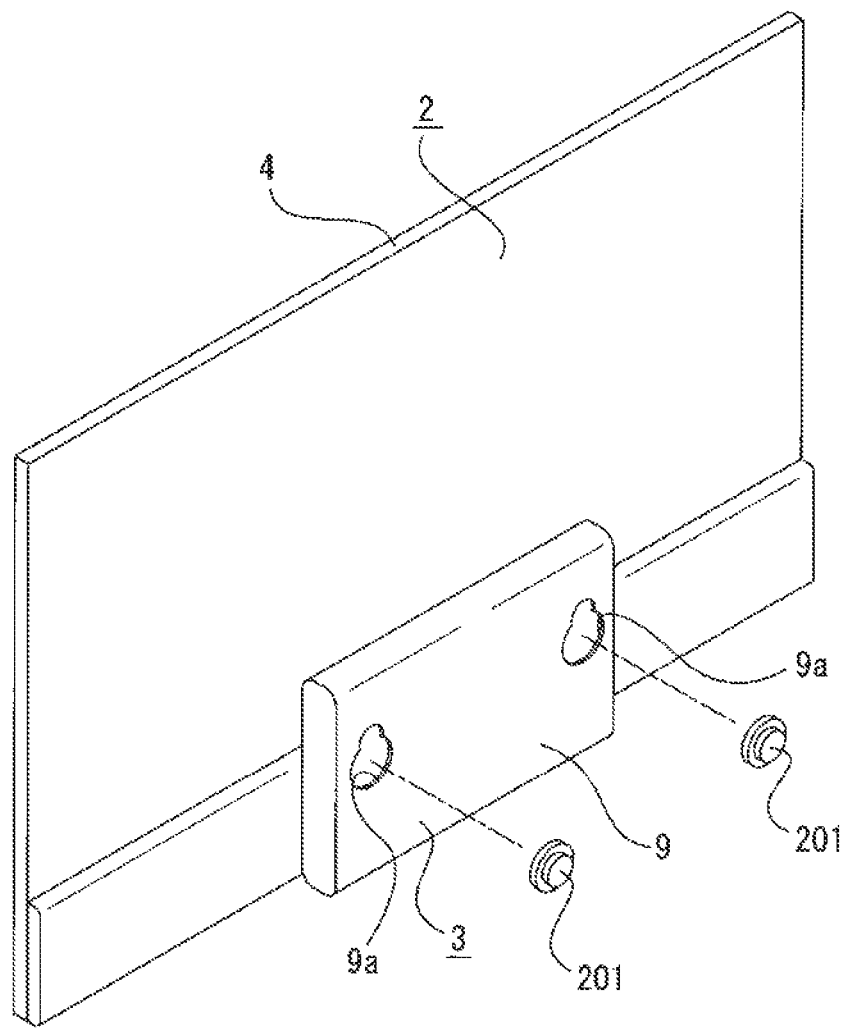

Hereinafter, an embodiment of the present disclosure will be described with reference to the drawings.

According to the following embodiment, a television receiver includes a display device of the present technology. Note that the scope of application of the present technology is not limited to a television receiver. For example, the present technology may be widely used for various devices and equipment, each of which functions as a display device. Examples of the display device include monitors used for a personal computer, a display system, and the like.

Hereinafter, the front, back, upper, lower, left, and right directions indicate the directions in which a user watches a display of a television receiver. In other words, the user side is the front side, and the inverse side is the back side.

Note that the front, back, upper, lower, left, and right directions are hereinafter used for ease of explanation. Implementation of the present technology is not limited to those directions.

[Structure of Display Device]

Hereinafter, the structure of a display device will be described (see FIG. 1 to FIG. 6).

A display device 1 includes a device main body 2 and a stand 3. The device main body 2 is a flat rectangular parallelepiped. The stand 3 supports the device main body 2 (see FIG. 1 and FIG. 2).

The device main body 2 includes a case 4 and a display 5. The case 4 is thin in the front-back direction. The case 4 holds the display 5.

The display 5 is, for example, a liquid crystal display. The display 5 includes a display surface 5a. The display surface 5a is the front surface of the display 5.

Rail members 6, 6 are mounted on the lower end portion of the back surface of the case 4. The rail members 6, 6 are distant from each other in the left-right direction (see FIG. 2).

The rail member 6 includes a mounted surface portion 7 and support portions 8, 8. The mounted surface portion 7 extends in the upper-lower direction, faces the front-back direction, and has a plate shape. The support portions 8, 8 are integrally provided on the left and right end portions of the mounted surface portion 7, respectively. The support portions 8, 8 protrude in directions, in which the support portions 8, 8 face each other (see FIG. 3). Support grooves 6a, 6a are formed between the mounted surface portion 7 and the support portions 8, 8, respectively. The support groove 6a extends in the upper-lower direction, and is internally open. The rail member 6 includes a stopper (not shown) at the lower end portion.

The mounted surface portions 7, 7 of the rail members 6, 6 are mounted on (for example, screwed in) the back surface of the case 4.

The stand 3 includes a support board portion 9 and support portions 10, 10. The support board portion 9 is mounted on a mount surface of a desk or the like. The support portions 10, 10 are mounted on the support board portion 9. The support portions 10, 10 are distant from each other in the left-right direction (see FIG. 2). Mounted holes 9a, 9a are formed on the back surface of the support board portion 9. The mounted holes 9a, 9a are distant from each other in the left-right direction. The mounted holes 9a, 9a are used for wall-hanging (see FIG. 6).

The support portion 10 includes a supported portion 11, a connection portion 12, a hinge shaft 13, and washers 14, 14, . . . (see FIG. 4 and FIG. 5).

The supported portion 11 includes a back plate 15, side plates 16, 16, hinge shaft mount portions 17, 17, and a supported plate 18. The back plate 15 extends in the upper-lower direction, faces the front-back direction, and has a plate shape. The side plates 16, 16 protrude from the left and right end portions of the back plate 15 in the back direction, respectively. The hinge shaft mount portions 17, 17 protrude from the lower end portions of the side plates 16, 16 in the back direction, respectively. The supported plate 18 is mounted on the front surface of the back plate 15.

The back plate 15 has a vertically-long semi-rectangular shape. The back plate 15 includes a reinforcement rib portion 15a. The reinforcement rib portion 15a is provided on the center portion between the left end portion and the right end portion of the back plate 15. The reinforcement rib portion 15a protrudes in the back direction. The reinforcement rib portion 15a increases the rigidity of the back plate 15.

The hinge shaft mount portions 17, 17 include hinge shaft mount holes 17a, 17a, respectively. Washer mount holes 17b, 17b are formed in front of and in back of the hinge shaft mount hole 17a, respectively. Concave portions 17c, 17c are formed on the outer circumferential portion of one hinge shaft mount portion 17. The concave portions 17c, 17c are distant from each other in the circumferential direction. Note that the number of concave portions 17c is not limited to two but may be an arbitrary value.

The supported plate 18 has a vertically-long rectangular shape. The supported plate 18 is mounted on the back plate 15. For example, the supported plate 18 is screwed in or welded on the back plate 15. The supported plate 18 includes slide portions 18a, 18a being the left and right end portions, respectively. The slide portions 18a, 18a protrude in the side (left and right) directions from the back plate 15, respectively. The slide portions 18*a*, 18*a* of the supported plate 18 are inserted in the support grooves 6*a*, 6*a*, respectively. The rail member 6 supports the support portion 10. The support portion 10 is slidable in the upper-lower direction.

The connection portions 12, 12 are mounted on the support board portion 9. Coupling surface portions 19, 19 of the connection portions 12, 12 are distant from each other in the left-right direction. The connection portion 12 includes the coupling surface portion 19 and side wall portions 20, 20. The coupling surface portion 19 has a semi-rectangular shape. Each of the side wall portions 20, 20 protrudes from one end portion in the longitudinal direction of the left or right end portion of the coupling surface portion 19. The side wall portions 20, 20 protrude in the direction orthogonal to the coupling surface portion 19. The side wall portions 20, 20 include shaft insertion holes 20*a*, 20*a*, respectively. The shaft insertion hole 20*a* is not circler but oval, for example. Washer couple holes 20*b*, 20*b* are formed on both sides of the shaft insertion hole 20*a*. A pin insertion hole 20*c* is formed on one side wall portion 20.

The hinge shaft 13 includes a head portion 21 and a shaft portion 22. The head portion 21 has a disk shape. The shaft portion 22 protrudes from a part of the head portion 21, which excludes the outer circumferential portion. The cross-section shape of the shaft portion 22 is the same as the shape of the shaft insertion hole 20*a*. For example, the cross-section shape of the shaft portion 22 is oval. A thread groove 22*a* is formed on the end portion of the shaft portion 22. A nut 23 is threadably mounted on the thread groove 22*a*.

The washer 14 includes an annular portion 14*a* and engagement projections 14*b*, 14*b*. The engagement projections 14*b*, 14*b* are provided on the annular portion 14*a*. The engagement projections 14*b*, 14*b* are opposite each other by 180°. The engagement projections 14*b*, 14*b* protrude in the axial direction of the annular portion 14*a*. Specifically, the engagement projections 14*b*, 14*b* protrude in the same direction.

For example, four washers 14, 14 . . . are provided. Two washers 14, 14 engage with the outer surfaces of the hinge shaft mount portions 17, 17, respectively. The engagement projections 14*b*, 14*b* . . . are inserted in the washer mount holes 17*b*, 17*b* . . . , respectively. The other two washers 14, 14 engage with the inner surfaces of the side wall portions 20, 20, respectively. The engagement projections 14*b*, 14*b*, . . . are inserted in the washer couple holes 20*b*, 20*b*, . . . , respectively.

The engagement projections 14*b*, 14*b*, engage with the washer mount holes 17*b*, 17*b*, . . . or the washer couple holes 20*b*, 20*b*, . . . . As a result, the washers 14, 14, . . . are mounted on the supported portion 11 and the connection portion 12, respectively. As a result, the washers 14, 14, . . . are not capable of rotating with respect to the hinge shaft mount portions 17, 17 and the side wall portions 20, 20.

The washers 14, 14 are sandwiched between each of the side wall portions 20, 20 of the connection portion 12 and each of the hinge shaft mount portions 17, 17. The side wall portions 20, 20 of the connection portion 12 are arranged on the outer surface sides of the hinge shaft mount portions 17, 17, respectively. The surfaces of the annular portions 14*a*, 14*a* of the washers 14, 14 mounted on the hinge shaft mount portions 17, 17 contact the annular portions 14*a*, 14*a* of the washers 14, 14 mounted on the side wall portions 20, 20, respectively.

The shaft portion 22 of the hinge shaft 13 is inserted in the shaft insertion hole 20*a* of one side wall portion 20, the washers 14, 14, the hinge shaft mount hole 17*a* of one hinge shaft mount portion 17, the hinge shaft mount hole 17*a* of the other hinge shaft mount portion 17, the washers 14, 14, and the shaft insertion hole 20*a* of the other side wall portion 20 in this order. The nut 23 is threadably mounted on the thread groove 22*a*.

The nut 23 is threadably mounted on the thread groove 22*a* of the hinge shaft 13. Because of this, two contacting washers 14, 14 are pressed against each other. The other two contacting washers 14, 14 are pressed against each other. As a result, a predetermined frictional force (friction) is generated.

The supported portion 11 and the connection portion 12 are relatively rotatable around the hinge shaft 13. The supported portion 11 and the connection portion 12 relatively rotate in the state where the frictional force is generated between the washers 14, 14, . . . . In other words, the washers 14, 14, . . . function as a friction mechanism.

The rail members 6, 6 are mounted on the case 4, and support the supported portions 11, 11, respectively. Because of this, when the supported portions 11, 11 rotate with respect to the connection portions 12, 12, the device main body 2 rotates with respect to the support board portion of the stand 3 along with the rotation of the supported portions 11, 11.

Meanwhile, the connection portions 12, 12 are mounted on the support board portion 9 of the stand 3. Because of this, when the connection portions 12, 12 rotate with respect to the supported portions 11, 11, the support board portion 9 rotates with respect to the device main body 2 along with the rotation of the connection portions 12, 12.

As described above, the shape of the shaft portion 22 of the hinge shaft 13 is the same as the shape of the shaft insertion holes 20*a*, 20*a* of the side wall portions 20, 20. The shaft portion 22 is not circular but oval, for example. Because of this, the hinge shaft 13 is not capable of rotating with respect to the connection portion 12 in the state where the hinge shaft 13 is inserted in the shaft insertion holes 20*a*, 20*a*. Because of this, when the connection portion 12 rotates with respect to the supported portion 11, the hinge shaft 13 and the connection portion 12 rotate together.

Further, the shaft portion 22 of the hinge shaft 13 is inserted in the circular hinge shaft mount holes 17*a*, 17*a* of the supported portion 11. Because of this, when the supported portion 11 rotates with respect to the connection portion 12, the supported portion 11 rotates with respect to the hinge shaft 13, and the hinge shaft 13 does not rotate.

[Behavior of Display Device in Standing Status]

Figure 7:
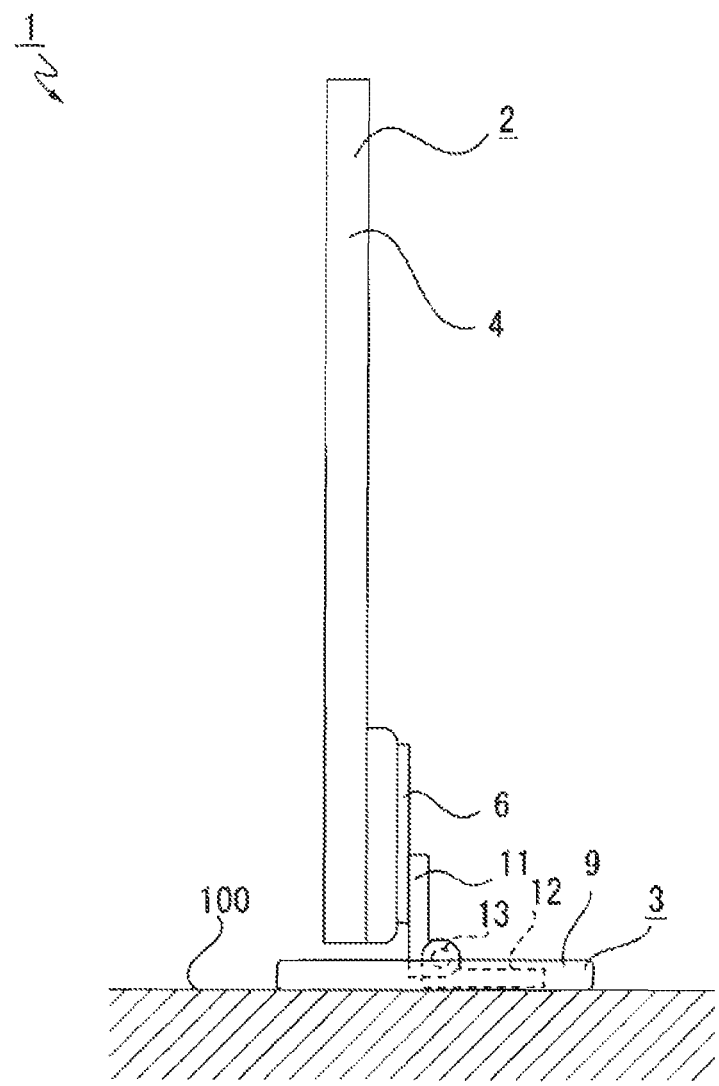
Figure 8:
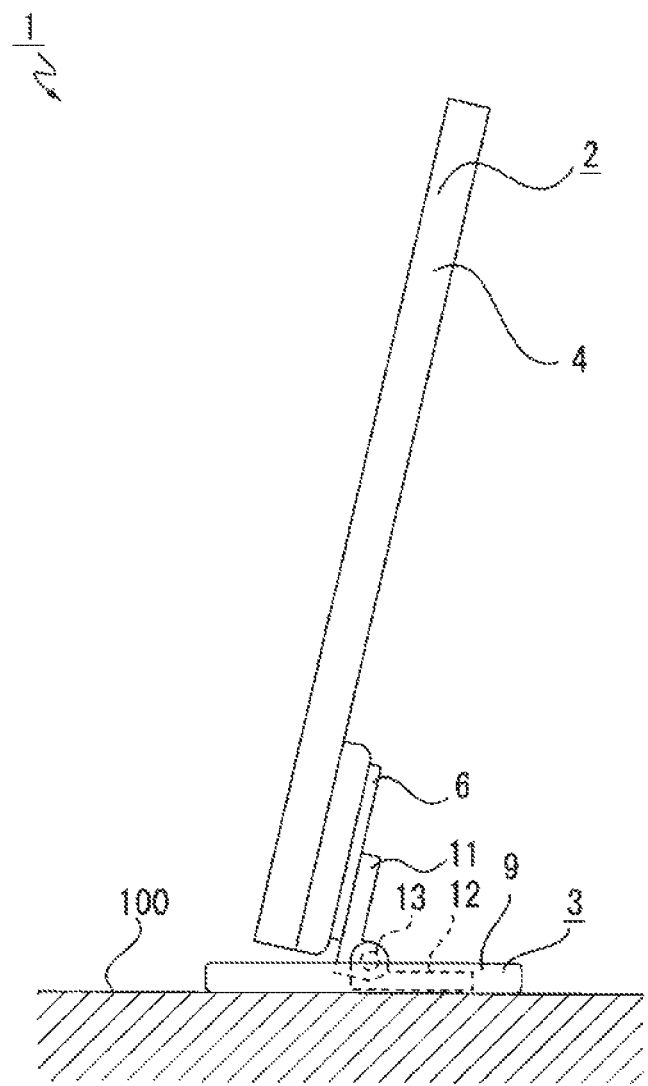

The stand 3 of the display device 1 structured as described above is mounted on a mount surface 100 of a desk or the like (standing status). The device main body 2 is rotatable with respect to the support board portion 9 of the stand 3 in the standing status. The angle of inclination of the device main body 2 with respect to the mount surface 100 may be changed in the standing status (see FIG. 7 and FIG. 8).

For example, the upper end portion of the case 4 is pressed in the front-back direction, and the device main body 2 may thus rotate with respect to the support board portion 9. As described above, when the device main body 2 rotates with respect to the support board portion 9, the supported portions 11, 11 rotate with respect to the connection portions 12, 12 in the state where a frictional force is generated between the washers 14, 14, . . . .

As described above, the display device 1 rotates in the state where a frictional force is generated between the washers 14, 14, . . . . Because of this, when the pressure on the case 4 is released, the device main body 2 is held at an arbitrary angle of inclination because of the frictional force. User-friendliness may thus be improved.

Figure 9:
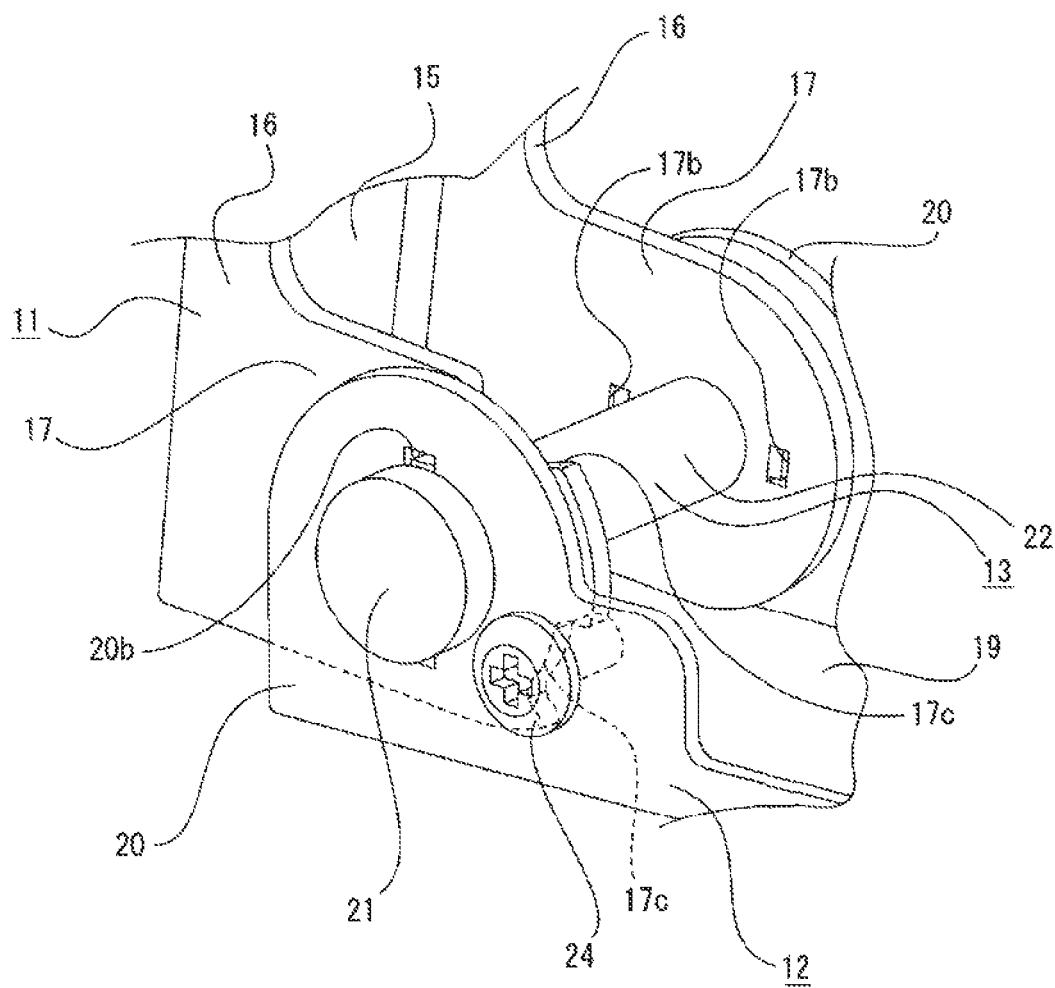

Further, when the device main body 2 rotates, a lock pin 24 is inserted in the pin insertion hole 20*c*. The lock pin 24 functions as a lock unit. The pin insertion hole 20c is formed on the side wall portion 20 of the connection portion 12. As a result, the device main body 2 is locked in a predetermined inclination state (see FIG. 9).

That is, the lock pin 24 is inserted in the pin insertion hole 20c. The concave portions 17c are formed on the hinge shaft mount portion 17 of the supported portion 11. The lock pin 24 engages with one of the concave portions 17c. Because the lock pin 24 engages with the concave portion 17c, rotation of the supported portion 11 with respect to the connection portion 12 is restricted. That is, the supported portion 11 is locked with respect to the connection portion 12. The device main body 2 is locked in a predetermined inclination state.

As described above, the lock unit is provided, and the lock unit locks the supported portion 11 with respect to the connection portion 12. As a result, the device main body 2 is prevented from falling down because of its weight. It is possible to prevent the device main body 2 from being broken or damaged. In addition, the device main body 2 is locked at a predetermined angle of inclination. User-friendliness may thus be improved.

Further, the plurality of concave portions 17c, 17c are formed on the supported portion 11. Because of this, it is possible to lock the device main body 2 at a plurality of positions. User-friendliness may thus be improved more.

Further, the lock pin 24 is used as the lock unit. That is, the lock unit has a simple structure. User-friendliness may thus be improved while the mechanism is simple.

Note that the lock pin 24 is inserted in the pin insertion hole 20c, to thereby lock the device main body 2. The lock pin 24 is pulled out from the pin insertion hole 20c, to thereby unlock the device main body 2. That is, lock and unlock operations are performed easily.

Further, in the above-mentioned example, the pin insertion hole 20c is formed on the connection portion 12. The lock pin 24 is inserted in the pin insertion hole 20c. The concave portions 17c, 17c, . . . are formed on the supported portion 11, and the lock pin 24 engages with the concave portions 17c, 17c, . . . . Alternatively, a pin insertion hole may be formed on the supported portion, and the lock pin 24 may be inserted in the pin insertion hole. Concave portions may be formed on the connection portion, and the lock pin 24 may engage with the concave portions.

Figure 10:
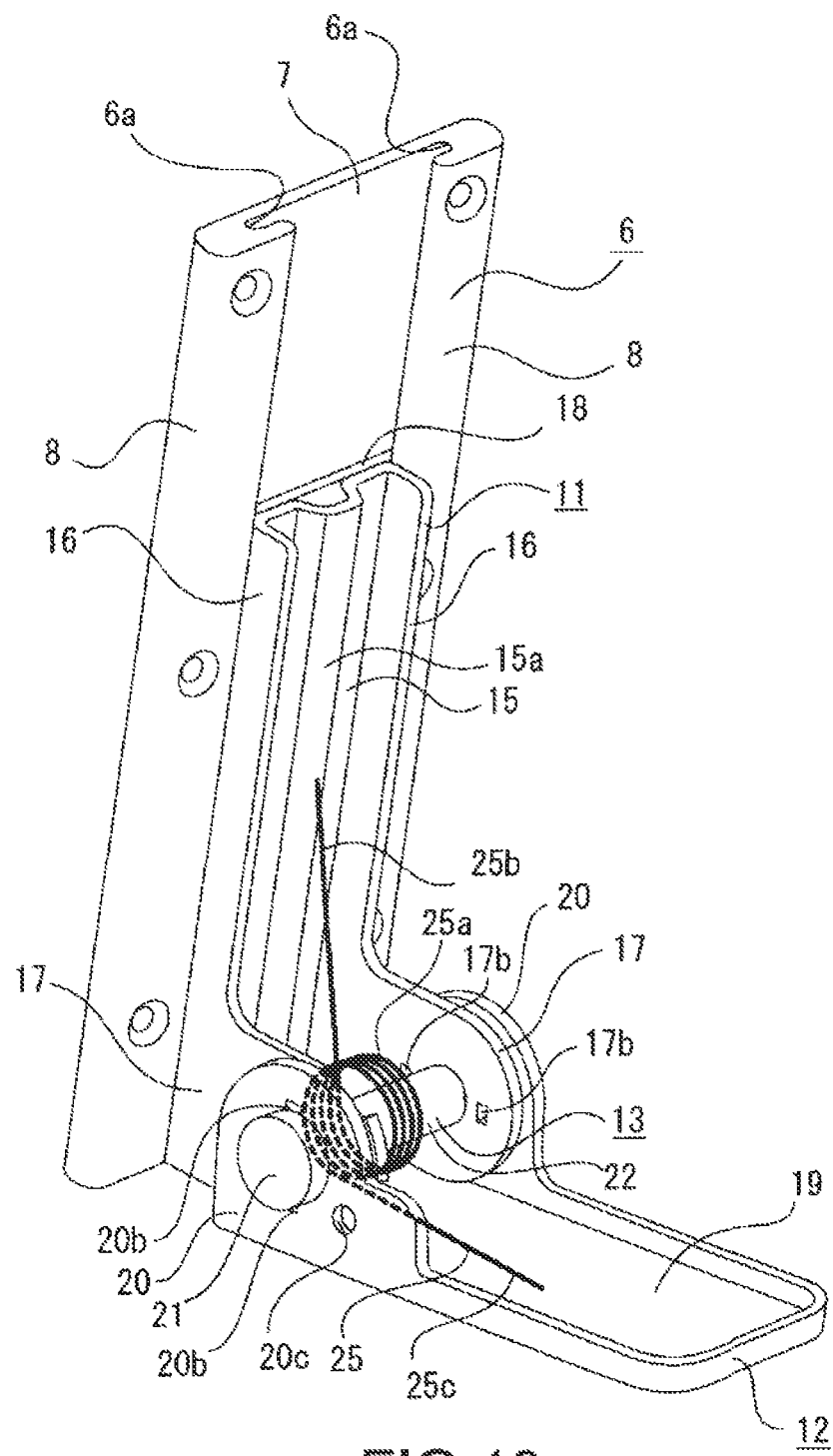

Note that, as described below, a spring member 25 of the display device 1 biases the device main body 2, to thereby prevent the device main body 2 from falling down because of its weight (see FIG. 10).

The spring member 25 is a torsion coil spring, for example. The hinge shaft 13 supports a coil portion 25a. One arm portion 25b is pressed against the supported portion 11. The other arm portion 25c is pressed against the connection portion 12. Because of this, the spring member 25 biases the stand 3 in a direction, in which the supported portion 11 and the connection portion 12 move apart from each other. In the standing status, the spring member 25 biases the stand 3 in a direction, in which the supported portion 11 rotates forward from the connection portion 12.

The spring member 25 biases the device main body 2 via the supported portion 11. Because of this, the spring member 25 prevents the device main body 2 from falling down in the back direction.

As described above, the spring member 25 prevents the device main body 2 from falling down because of its weight. Because of this, it is possible to prevent the device main body 2 from falling down because of its weight with a simple structure and without largely increasing the number of components.

Figure 11:
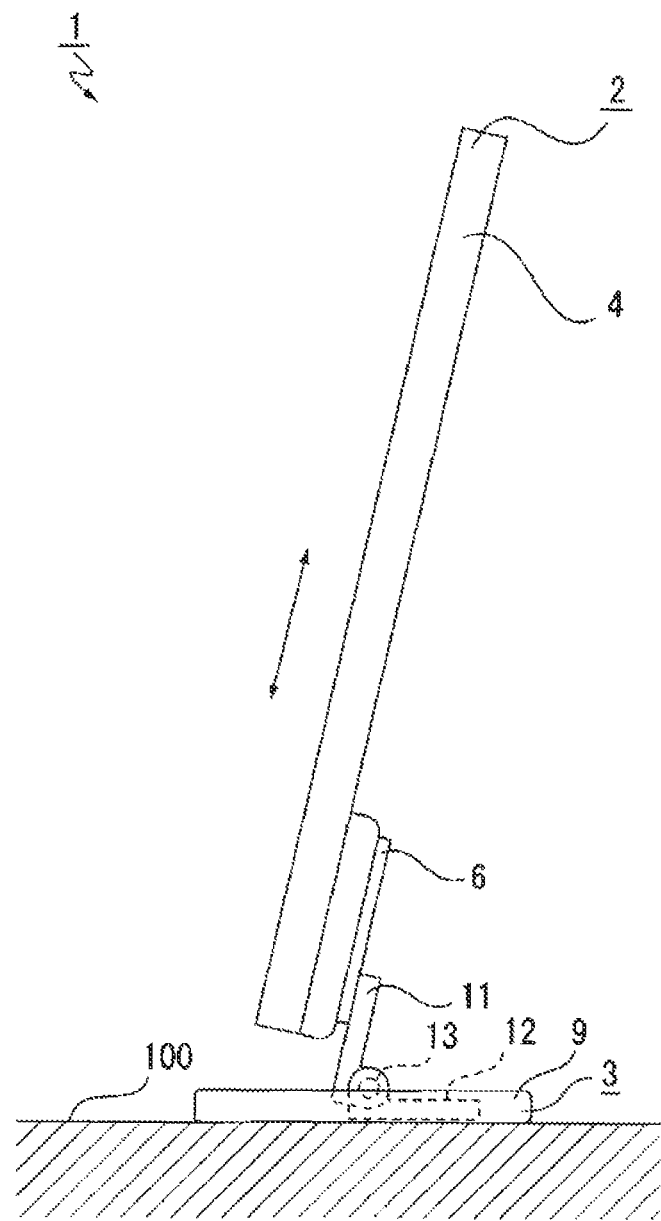

In the standing status where the stand 3 of the display device 1 is mounted on the mount surface 100 such as a desk, the rail members 6, 6 are slid with respect to the supported portions 11, 11. As a result, the height of the device main body 2 is adjusted (see FIG. 11).

The height of the device main body 2 is adjusted, and the device main body 2 stops at a position where the rail members 6, 6 contact the support board portion 9 of the stand 3.

As described above, the height of the device main body 2 may be adjusted in the standing status. As a result, the height of the display surface 5a is adjusted. User-friendliness may thus be improved.

[Behavior of Display Device in Wall-Hanged Status]

Figure 12:
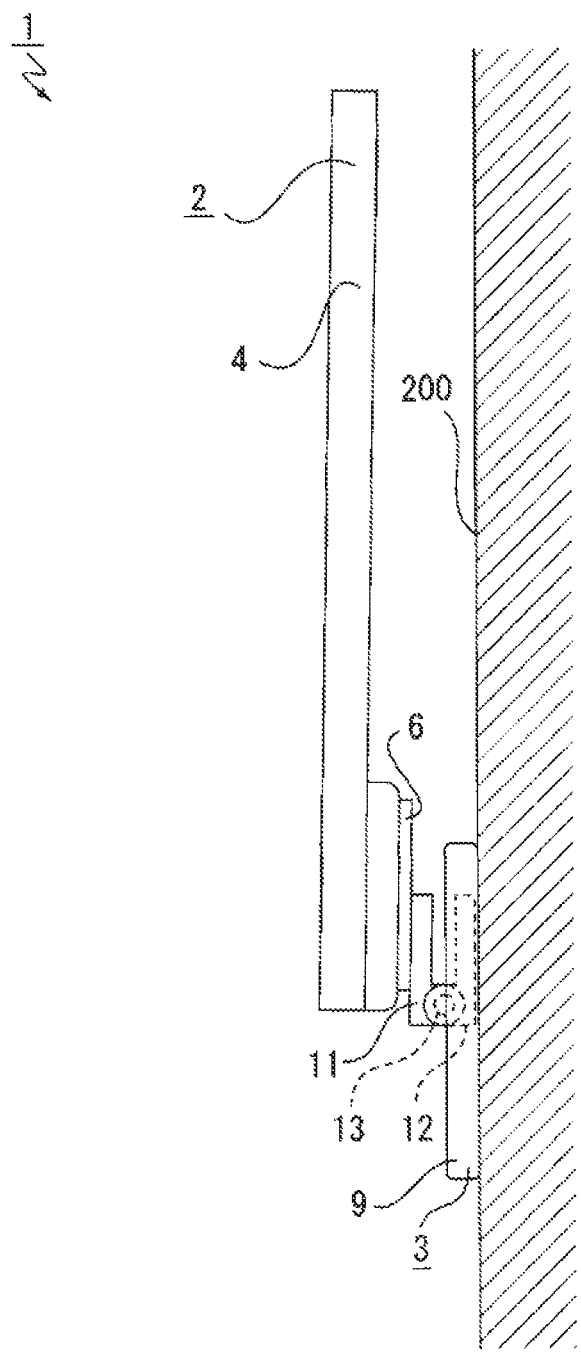
Figure 13:
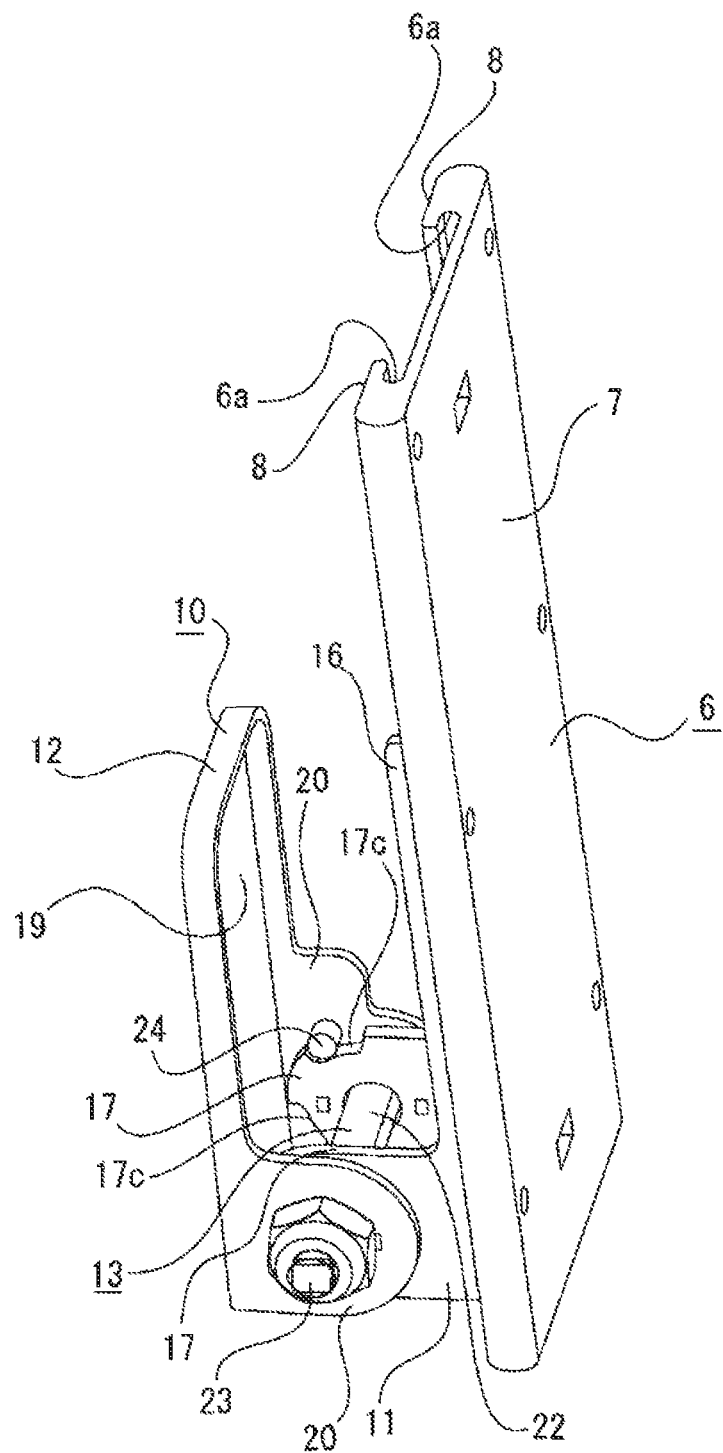

The connection portions 12, 12 rotate with respect to the supported portions 11, 11 at the maximum within the rotation range. As a result, the display device 1 is hanged in the wall-hanged status (see FIGS. 12 and 13). The connection portions 12, 12 rotate at the maximum within the rotation range. Then, the coupling surface portions 19, 19 of the connection portions 12, 12 face the rail members 6, 6 and the back plates 15, 15 of the supported portions 11, 11.

The connection portions 12, 12 rotate at the maximum within the rotation range. At this time, the back surface of the support board portion 9 faces the back direction. At this time, mount pins 201, 201 (see FIG. 6) are mounted on a wall surface 200. As a result, the mount pins 201, 201 may be inserted in the mounted holes 9a, 9a of the support board portion 9, and the display device 1 may be mounted on the wall surface 200 (see FIG. 12).

As described above, the mounted holes 9a, 9a are formed on the support board portion 9 of the stand 3. Because of this, it is not necessary to additionally provide single-purpose wall-hanging unit. The display device 1 may be mounted on the wall surface 200 with a simple structure easily.

Further, for example, in a case where a bracket (not shown) for wall-hanging is mounted on the wall surface 200, the support board portion 9 of the display device 1 may include a structure, which is to be mounted on the bracket. Because of this, the support board portion 9 may be mounted on the bracket and may be hanged in the wall-hanged status.

Similar to the above-mentioned standing status, the device main body 2 rotates with respect to the support board portion 9 of the stand 3 in the wall-hanged status. As a result, the angle of inclination of the device main body 2 with respect to the wall surface 200 may be changed.

The rotation behavior is performed in the wall-hanged status in the state where a frictional force is generated between the washers 14, 14, . . . . As a result, the device main body 2 is held at an arbitrary angle of inclination because of the frictional force. User-friendliness may thus be improved.

Further, the lock pin 24 functions as the lock unit. The pin insertion hole 20c is formed on the side wall portion 20 of the connection portion 12. In the wall-hanged status, the lock pin 24 is inserted in the pin insertion hole 20c. As a result, the device main body 2 may be locked at a predetermined inclination state (see FIG. 13).

In the wall-hanged status, the supported portions 11, 11 of the display device 1 are relatively slid with respect to the rail members 6, 6. As a result, the height of the device main body 2 may be adjusted.

Figure 14:
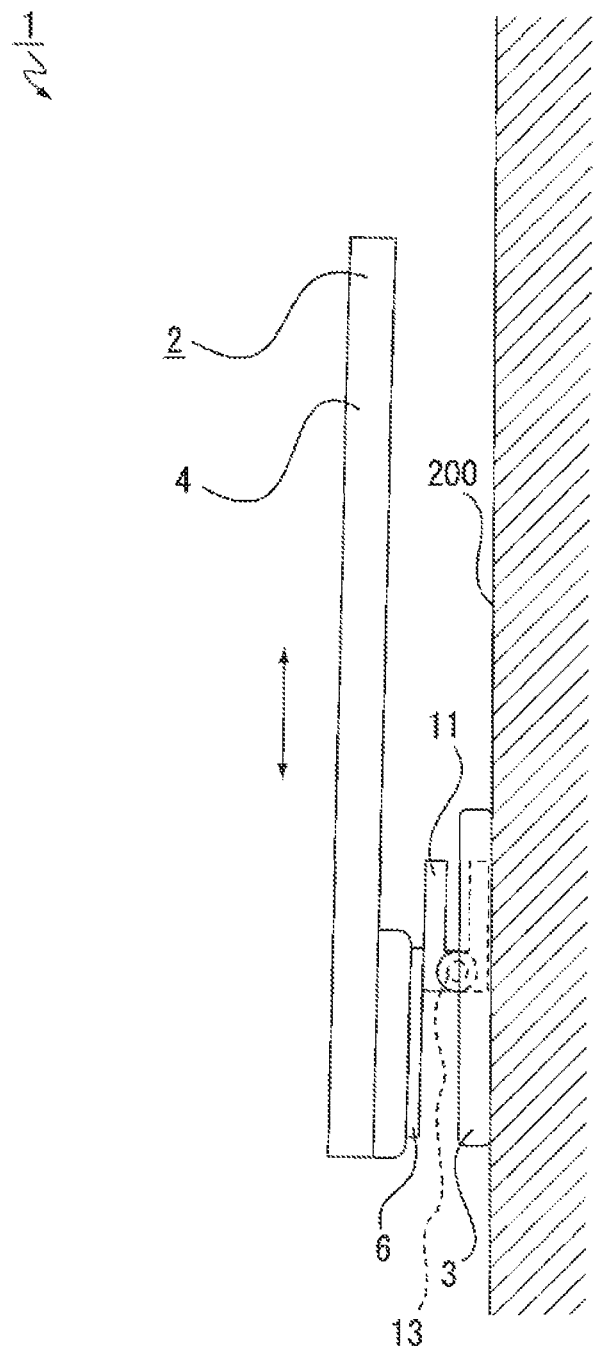

In the wall-hanged status, for example, the supported portions 11, 11 are relatively slid with respect to the rail members 6, 6. As a result, the device main body 2 moves in the lower direction. As a result, the entire support board portion 9 comes behind the device main body 2. In the wall-hanged status, the stand 3 may be placed at the back surface side of the device main body 2 (see FIG. 14).

The stand 3 is placed at the back surface side of the device main body 2. Because of this, a viewer may not see the stand 3. The visual quality may thus be improved.

Other Examples

Figure 15:
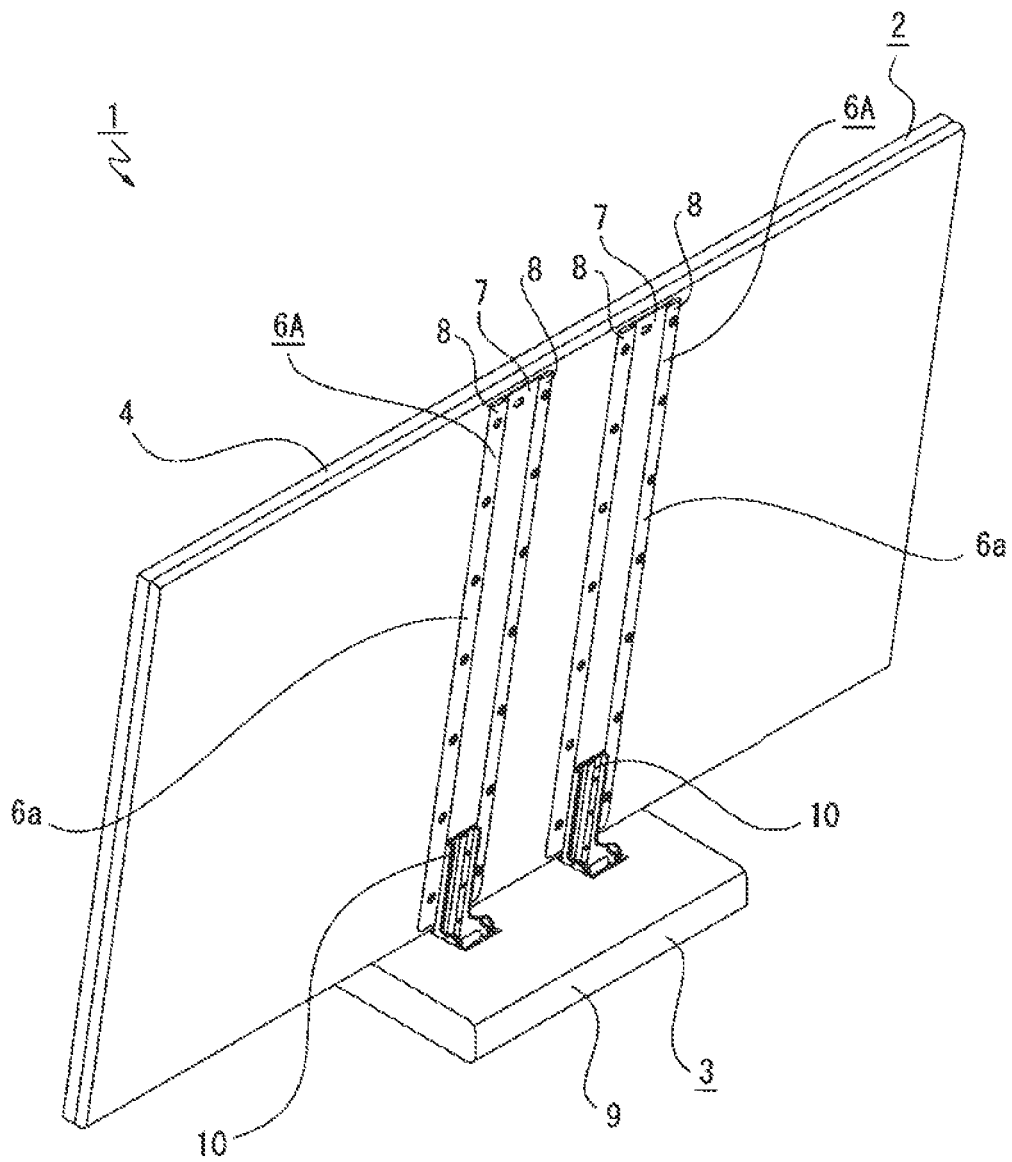

In the above-mentioned examples, the rail members 6, 6 are mounted on the lower end portion of the case 4. Alternatively, for example, rail members 6A, 6A may be mounted on the case 4. The rail members 6A, 6A are longer than the rail members 6, 6. The rail members 6A, 6A may extend from the upper end portion to the lower end portion of the case 4 (see FIG. 15).

As described above, the rail members 6A, 6A extend from the upper end portion to the lower end portion of the case 4. Because of this, the position of the device main body 2 may be adjusted within a larger range. Visibility of images displayed on the display surface 5a may be improved. User-friendliness may thus be improved.

Figure 16:
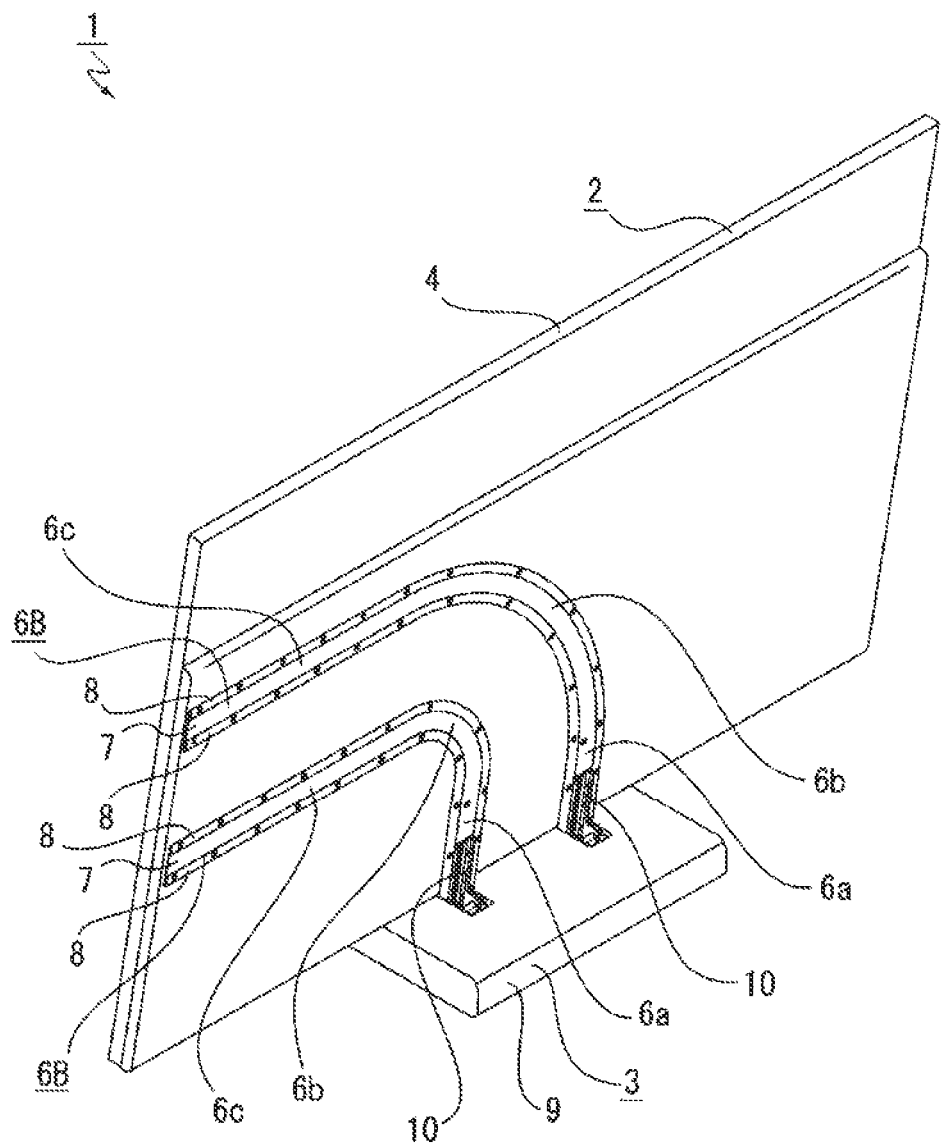
Figure 17:
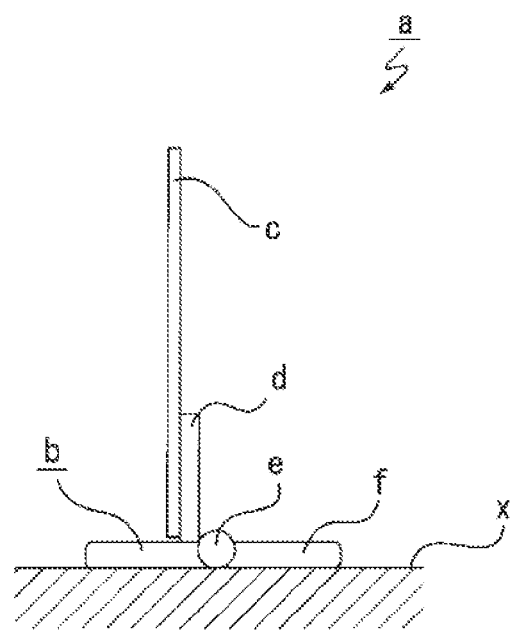
FIG. 17 to FIG. 20 are diagrams each showing a display device of a related art.
Figure 18:
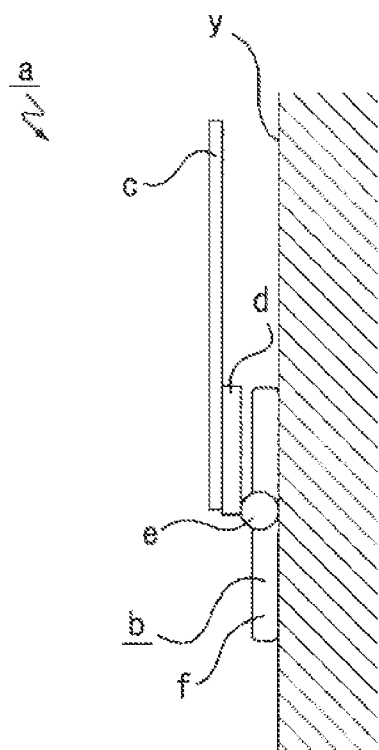
Figure 19:
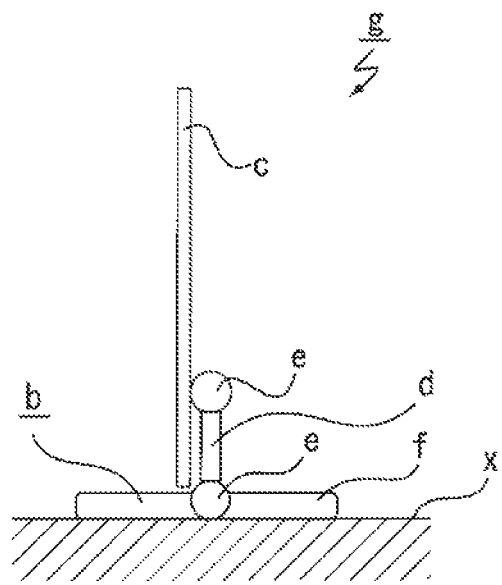
Figure 20:
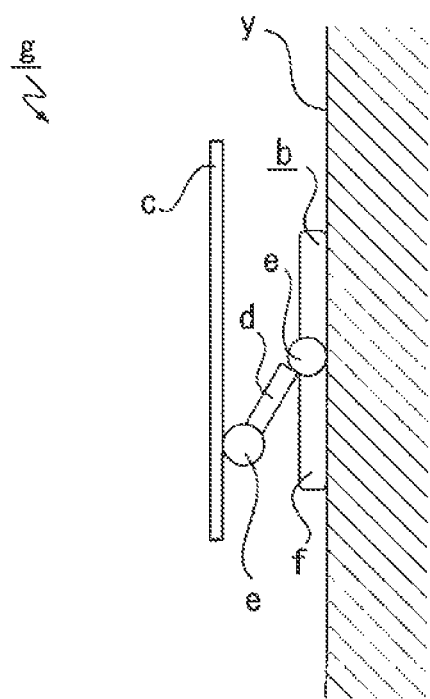

Alternatively, instead of the rail members 6, 6, 6A, 6A, rail members 6B, 6B may be mounted on the case 4. The rail members 6B, 6B are bent (see FIG. 16).

The rail member 6b includes, for example, a vertical portion 6a, a middle portion 6b, and a horizontal portion 6c. The vertical portion 6a extends in the upper-lower direction. The middle portion 6b connects to the upper end of the vertical portion 6a, and has an arc shape. The horizontal portion 6c connects to one end of the middle portion 6b, and extends in the left-right direction.

In the case where the above-mentioned rail members 6B, 6B are used, the supported portions 11, 11 of the stand 3 are slidable along the rail members 6B, 6B each having such shapes. It is possible to arbitrarily set the relative posture of the device main body 2 with respect to the stand 3 depending on the shapes of the rail members 6B, 6B.

Specifically, the rail members 6B, 6B include the vertical portions 6a, 6a and the horizontal portions 6c, 6c. The vertical portion 6a and the horizontal portion 6c extend in the orthogonal directions, respectively. As a result, the display 5 of the device main body 2 is turned around by 90° between the vertically-long status and the horizontally-long status.

The display 5 of the device main body 2 is turned around by 90° between the vertically-long status and the horizontally-long status. As a result, an image may be displayed on the display surface 5a with consideration of the size and the aspect ratio of the image. User-friendliness to visibility of images may thus be improved.

Note that the display 5 may be controlled as follows. The display 5 is turned around by 90° between the vertically-long status and the horizontally-long status. In this case, a displayed image is turned around by 90°. The upper-lower and left-right directions of an image may always coincide with the upper-lower and left-right directions of the display 5, which is turned around.

CONCLUSION

As described above, the stand 3 of the display device 1 includes the supported portions 11, 11 and the connection portions 12, 12 at the back surface of the device main body 2. The supported portions 11, 11 are slidably supported. The hinge shafts 13, 13 allow the connection portions 12, 12 to rotate.

As a result, the single hinge structure including one hinge shaft 13 may make the structure simple. In addition, the entire stand 3 may be at the back surface side of the device main body 2. As a result, the structure may be made simple and downsized.

THE PRESENT TECHNOLOGY

The present technology may employ the following structures.

(1) A display device, comprising:
a device main body including a display, the display including a display surface, the display surface being configured to display an image; and
a stand configured to support the device main body, wherein
the stand includes
a supported portion, the supported portion being slidably supported on a surface opposite to the display surface of the device main body, and
a connection portion, the connection portion being rotatable with respect to the supported portion around a hinge shaft.

(2) The display device according to (1), further comprising:
a lock unit configured to lock one of the supported portion and the connection portion with respect to the other of the connection portion and the supported portion within a rotation range.

(3) The display device according to (1) or (2), wherein
a plurality of concave portions are formed on one of the supported portion and the connection portion, the plurality of concave portions being distant from each other, and
the lock unit is mounted on the other of the connection portion and the supported portion, the lock unit engages with one of the concave portions, and the lock unit is locked.

(4) The display device according to any one of (1) to (3), further comprising:
a lock pin as the lock unit, the lock pin being inserted in the other of the connection portion and the supported portion.

(5) The display device according to any one of (1) to (4), further comprising:
a friction mechanism configured to generate friction between the connection portion and the supported portion.

(6) The display device according to any one of (1) to (5), wherein
a mounted hole for wall-hanging is formed on the connection portion of the stand.

(7) The display device according to any one of (1) to (6), further comprising:
a rail member provided on the opposite surface of the device main body, the rail member being configured to slidably support the supported portion, wherein
the rail member is provided on the device main body, the rail member extending from one end portion to the other end portion in a direction orthogonal to the thickness direction of the display.

(8) The display device according to (7), wherein
the rail member is bent.

(9) The display device according to (8), wherein
the rail member is provided such that a direction in which one end in the longitudinal direction extends is orthogonal to a direction in which the other end extends.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a main body having a display which includes a display surface to display an image;
   a stand to support the main body; and
   a connection assembly to rotatably and slidably connect the main body and the stand together,
   the connection assembly having (i) at least one rail member coupled to the main body on a surface opposite to the display surface and (ii) at least one support assembly each including a first support member and a second support member which are rotatably coupled together,
   each said first support member being slidably coupled to a respective one of each said rail member and each said second support member being fixedly coupled to the stand such that when the stand is placed on a horizontal or substantially horizontal surface the main body is rotatable relative to the stand and the main body is adjustable in a direction away from the stand.

2. The display device according to claim 1, further comprising:
   a lock unit configured to lock one of the first support member and the second support member with respect to the other of the first support member and the second support member within a rotation range.

3. The display device according to claim 2, wherein
   a plurality of concave portions are formed on one of the first support member and the second support member, the plurality of concave portions being distant from each other, and
   the lock unit is mounted on the other of the first support member and the second support member, the lock unit engages with one of the concave portions, and the lock unit is locked.

4. The display device according to claim 3, further comprising:
   a lock pin as the lock unit, the lock pin being inserted in the other of the first support member and the second support member.

5. The display device according to claim 1, further comprising:
   a friction mechanism configured to generate friction between the first support member and the second support member.

6. The display device according to claim 1, wherein
   a mounted hole for wall-hanging is formed on the stand.

7. The display device according to claim 1,
   wherein
   each said rail extends from one end portion to another end portion in a direction orthogonal to a thickness direction of the display.

8. The display device according to claim 7, wherein
   each said rail member is bent.

9. The display device according to claim 8, wherein
   each said rail member is provided such that a direction in which one end in the longitudinal direction extends is orthogonal to a direction in which the other end extends.

* * * * *